US012736568B2

(12) United States Patent
Feng et al.

(10) Patent No.: US 12,736,568 B2
(45) Date of Patent: Sep. 15, 2026

(54) WIRELESS PERFORMANCE TESTING METHOD AND SYSTEM BASED ON QUIET ZONE EXPANSION IN A COMPACT ANTENNA TEST RANGE

(71) Applicants: China Automotive Technology and Research Center Co., Ltd., Tianjin (CN); Catarc Automotive Test Center (Tianjin) Co., Ltd., Tianjin (CN)

(72) Inventors: Jiaxu Feng, Tianjin (CN); Changqing Dong, Tianjin (CN); Kongjian Qin, Tianjin (CN); Guokai Jiang, Tianjin (CN); Feiyan Wu, Tianjin (CN); Xiaodi Tian, Tianjin (CN); Fujian He, Tianjin (CN); Qipeng Zhang, Tianjin (CN); Zhe Tian, Tianjin (CN); Meng Zhao, Tianjin (CN); Quan Wen, Tianjin (CN); Zhiqiang Yang, Tianjin (CN); Guotian Ji, Tianjin (CN); Jinman Guo, Tianjin (CN); Miaomiao Sheng, Tianjin (CN)

(73) Assignees: China Automotive Technology and Research Center Co., Ltd., Tianjin (CN); Catarc Automotive Test Center (Tianjin) Co., Ltd., Tianjin (CN)

( * ) Notice: Subject to any disclaimer, the term of this patent is extended or adjusted under 35 U.S.C. 154(b) by 112 days.

(21) Appl. No.: 18/968,975

(22) Filed: Dec. 4, 2024

(65) Prior Publication Data

US 2025/0208182 A1 Jun. 26, 2025

(30) Foreign Application Priority Data

Dec. 26, 2023 (CN) ........................ 202311800192.X

(51) Int. Cl.
*G01R 29/08* (2006.01)

(52) U.S. Cl.
CPC ..... *G01R 29/0821* (2013.01); *G01R 29/0871* (2013.01)

(58) Field of Classification Search
CPC ............ G01R 29/0821; G01R 29/0871; G01R 29/105; H04B 17/15; H04B 17/29
See application file for complete search history.

(56) References Cited

U.S. PATENT DOCUMENTS 7,925,253 B2 * 4/2011 Breit ..................... H04W 56/00 455/418
10,725,079 B2 * 7/2020 Kvarnstrand ...... G01R 29/0821
(Continued)

FOREIGN PATENT DOCUMENTS

CN 112034266 A 12/2020
CN 116359620 A 6/2023

*Primary Examiner* — Seung H Lee
(74) *Attorney, Agent, or Firm* — IPro, PLLC

(57) ABSTRACT

The present disclosure provides a wireless performance testing method and system based on quiet zone expansion in a compact antenna test range. The wireless performance testing method is implemented based on a wireless performance testing device and includes: to acquire an original phase of the feed antenna; rotate the turntable to obtain a first scattering parameter of the device under test; input the first distance to a phase compensation model to obtain a compensation phase; adjust the original phase of the feed antenna to the adjusted phase; rotate the turntable to obtain a second scattering parameter of the device under test; move the feed antenna along the first straight line repeatedly to different positions to obtain a plurality of the second scattering parameters. The wireless performance testing method can increase the size of the test quiet zone under the condition that the reflecting surface size is certain.

10 Claims, 10 Drawing Sheets

(56) References Cited

U.S. PATENT DOCUMENTS

| | | | | |
|---|---|---|---|---|
| 11,032,012 | B2 * | 6/2021 | Rowell | H04B 17/391 |
| 11,146,342 | B1 * | 10/2021 | Li | H04B 17/0087 |
| 2021/0067257 | A1 * | 3/2021 | Lin | H04B 17/191 |

* cited by examiner

WIRELESS PERFORMANCE TESTING METHOD AND SYSTEM BASED ON QUIET ZONE EXPANSION IN A COMPACT ANTENNA TEST RANGE

CROSS-REFERENCE TO RELATED APPLICATIONS

This application is based on and claims the benefit of priority to the Chinese patent application No. 202311800192.X filed on Dec. 26, 2023, which is hereby incorporated by reference in its entirety into the present application.

TECHNICAL FIELD

The present disclosure generally relates to the technical field of compact antenna test range, and particularly relates to a wireless performance testing method and system based on quiet zone expansion in a compact antenna test range.

BACKGROUND

With the rapid development of mobile communication technology, a new system and network architecture are introduced to achieve high-reliability communication featuring enhanced mobile bandwidth and ultra-low latency. A new multiple access, modulation, and coding method makes the previous conduction testing inapplicable, and over-the-air (OTA) testing needs to be performed to test wireless performance. The OTA testing can be classified into three main categories: direct far-field testing, near-field to far-field transform testing and compact antenna test range testing. Since the direct far-field testing requires a large field and high costs, and the near-field to far-field transform testing is difficult to achieve, the compact antenna test range testing becomes a better choice.

The compact antenna test range testing is mainly composed of an anechoic chamber, a test feed antenna, a reflecting surface and a test link. In the compact antenna test range testing, the feed antenna transmits a signal, which is reflected by the reflecting surface to convert spherical waves into plane waves to form a quiet zone, and a device under test receives the signal to complete the testing. To build a compact antenna test range testing system with a quiet zone size of 2×2 m, an anechoic chamber with a size about 15×10 m is required. Currently, a larger device under test, such as vehicle OTA testing, requires a larger quiet zone, which in turn requires a reflecting surface having a larger size and an anechoic chamber having a larger volume, such that testing costs increase and it is more difficult to build a more spacious anechoic chamber.

SUMMARY

In view of the above-mentioned defects or deficiencies in the prior art, it is desirable to provide a wireless performance testing method and system based on quiet zone expansion in a compact antenna test range to solve the above-mentioned problems.

In a first aspect, the present disclosure provides a wireless performance testing method based on quiet zone expansion in a compact antenna test range; the wireless performance testing method is implemented based on a wireless performance testing device, the wireless performance testing device includes a microwave anechoic chamber, a feed antenna arranged inside the microwave anechoic chamber, a reflector, and a turntable; a device under test is placed on the turntable, the turntable is configured to drive the device under test to rotate; the reflector has a reflecting surface, the feed antenna is arranged between the reflecting surface and the turntable, and a center of the reflecting surface, a focal point of the reflecting surface and a center of the device under test are all aligned on a same straight line; and the feed antenna can be moved along a first straight line, and the first straight line passes through the focal point of the reflecting surface and is perpendicular to a line connecting the center of the reflecting surface and the center of the device under test; and the wireless performance testing method includes the following steps:

place the feed antenna at the focal point of the reflecting surface to form an original quiet zone, and acquire an original phase of the feed antenna;

rotate the turntable to obtain a first scattering parameter of the device under test, where the first scattering parameter is used to characterize wireless communication performance of the device under test in the original quiet zone;

move the feed antenna along the first straight line, with a moving distance of the feed antenna designated as a first distance;

input the first distance to a phase compensation model to obtain a compensation phase;

compensate the original phase according to the compensation phase to obtain an adjusted phase, adjust the original phase of the feed antenna to the adjusted phase to form an adjusted quiet zone;

rotate the turntable to obtain a second scattering parameter of the device under test, where the second scattering parameter is used to characterize the wireless communication performance of the device under test in the adjusted quiet zone; and move the feed antenna along the first straight line repeatedly to different positions to obtain a plurality of the second scattering parameters; and the first scattering parameter and the plurality of the second scattering parameters are used to jointly characterize the wireless communication performance of the device under test.

In an embodiment of the present disclosure, the first scattering parameter or each of the second scattering parameters includes at least a reverse transmission coefficient, a forward transmission coefficient, an input reflection coefficient, and an output reflection coefficient.

In an embodiment of the present disclosure, the compensation phase is calculated via the phase compensation model according to Formula (I):

$$\Phi(x, y) = \frac{2\pi}{\lambda}L - x\sin(\theta)\cos(\beta) + y\sin(\theta)\sin(\beta) \quad \text{Formula (I)}$$

where $\phi(x, y)$ represents a phase compensation value, A represents a wavelength corresponding to an operating frequency of the feed antenna, L represents a first distance, x represents a horizontal distance of the feed antenna relative to the focal point of the reflecting surface, y represents a vertical distance of the feed antenna relative to the focal point of the reflecting surface, θ represents an elevation angle of the feed antenna in a spherical coordinate system, and β represents an azimuth angle of the feed antenna in the spherical coordinate system; and the spherical coordinate system takes the center of the reflecting surface as an origin of coordinates, a straight line passing through the center of the reflecting surface and perpendicular to the reflecting surface as an X-axis, a straight line passing through the center of the reflecting surface, perpendicular to the reflecting surface and parallel to a horizontal direction as a Y-axis, and a straight line passing through the center of the reflecting surface, perpendicular to both the X-axis and the Y-axis as a Z-axis.

In an embodiment of the present disclosure, the first distance is an integer multiple of a step pitch of the feed antenna, and the step pitch of the feed antenna is calculated according to Formula (II):

$$A = \frac{F^2 \times 0.1}{D \times \lambda} \quad \text{Formula (II)}$$

where A represents step pitch of the feed antenna, F represents a focal length of the reflecting surface, and D represents a maximum diameter of the reflecting surface.

In an embodiment of the present disclosure, orthographic projection of the reflecting surface is a rectangle, a longer side length of the orthographic projection is 18 times a wavelength corresponding to the operating frequency of the feed antenna, a shorter side length of the orthographic projection is 14 times the wavelength corresponding to the operating frequency of the feed antenna, and the focal length of the reflecting surface is 18 times wavelength corresponding to the operating frequency of the feed antenna.

In an embodiment of the present disclosure, orthographic projection of the reflecting surface is a rectangle, a longer side length of the orthographic projection is 20 times a wavelength corresponding to the operating frequency of the feed antenna, a shorter side length of the orthographic projection is 15 times the wavelength corresponding to the operating frequency of the feed antenna, and the focal length of the reflecting surface is 20 times wavelength corresponding to the operating frequency of the feed antenna.

In a second aspect, the present disclosure provides a test system that is used to implement the wireless performance test method based on quiet zone expansion in a compact antenna test range. The test system includes the wireless performance testing device, and further includes the following components arranged outside the microwave anechoic chamber:

a processor, the processor is configured to obtain an original phase of the feed antenna; the processor is also configured to obtain a first distance that the feed antenna moves; the first distance is inputted to a phase compensation model to obtain a compensation phase; and the original phase is compensated according to the compensation phase to obtain an adjusted phase, and the original phase of the feed antenna is adjusted to the adjusted phase; and a tester, the tester is configured to obtain a first scattering parameter of the device under test; and the tester is also configured to obtain second scattering parameter of the device under test.

In an embodiment of the present disclosure, inner sides of walls of the microwave anechoic chamber are lined with absorbing material.

In an embodiment of the present disclosure, the reflecting surface is a parabolic reflecting surface, and a concave side thereof faces the device under test.

In an embodiment of the present disclosure, the wireless performance testing device also includes the scanning frame, the scanning frame is arranged between the reflecting surface and the turntable; and the scanning frame is provided with a plurality of mounting positions for mounting the feed antenna, and the plurality of mounting positions are evenly arranged along a first straight line.

Compared with the prior art, the present disclosure has the following beneficial effects: an original quiet zone is formed by the feed antenna and the reflecting surface, and the device under test is placed on the turntable, such that the first scattering parameter of the device under test can be obtained in the original quiet zone when the turntable is rotated; by moving the feed antenna along the straight line passing through the focal point of the reflecting surface, an adjusted quiet zone is formed after the feed antenna is moved, the first distance moved by the feed antenna is then inputted to a phase compensation model to obtain phase compensation information, and the phase compensation information is used to compensate the adjusted phase information, such that the phase compensation makes a phase of the adjusted quiet zone same as that of the original quiet zone despite that the position of the quiet zone changes, that is, the adjusted phase information is adjusted to be close to the original phase information, such that the accuracy of test results can be guaranteed when the device under test is tested in the adjusted quiet zone; therefore, the wireless performance testing method can expand a range of the quiet zone by moving the position of the feed antenna without changing a size of the reflecting surface, thereby saving testing costs and improving testing efficiency.

BRIEF DESCRIPTION OF THE DRAWINGS

Other features, objectives, and advantages of the present disclosure will become apparent after reading the detailed description of non-limiting embodiments with reference to the accompanying drawings below.

Figure 1:
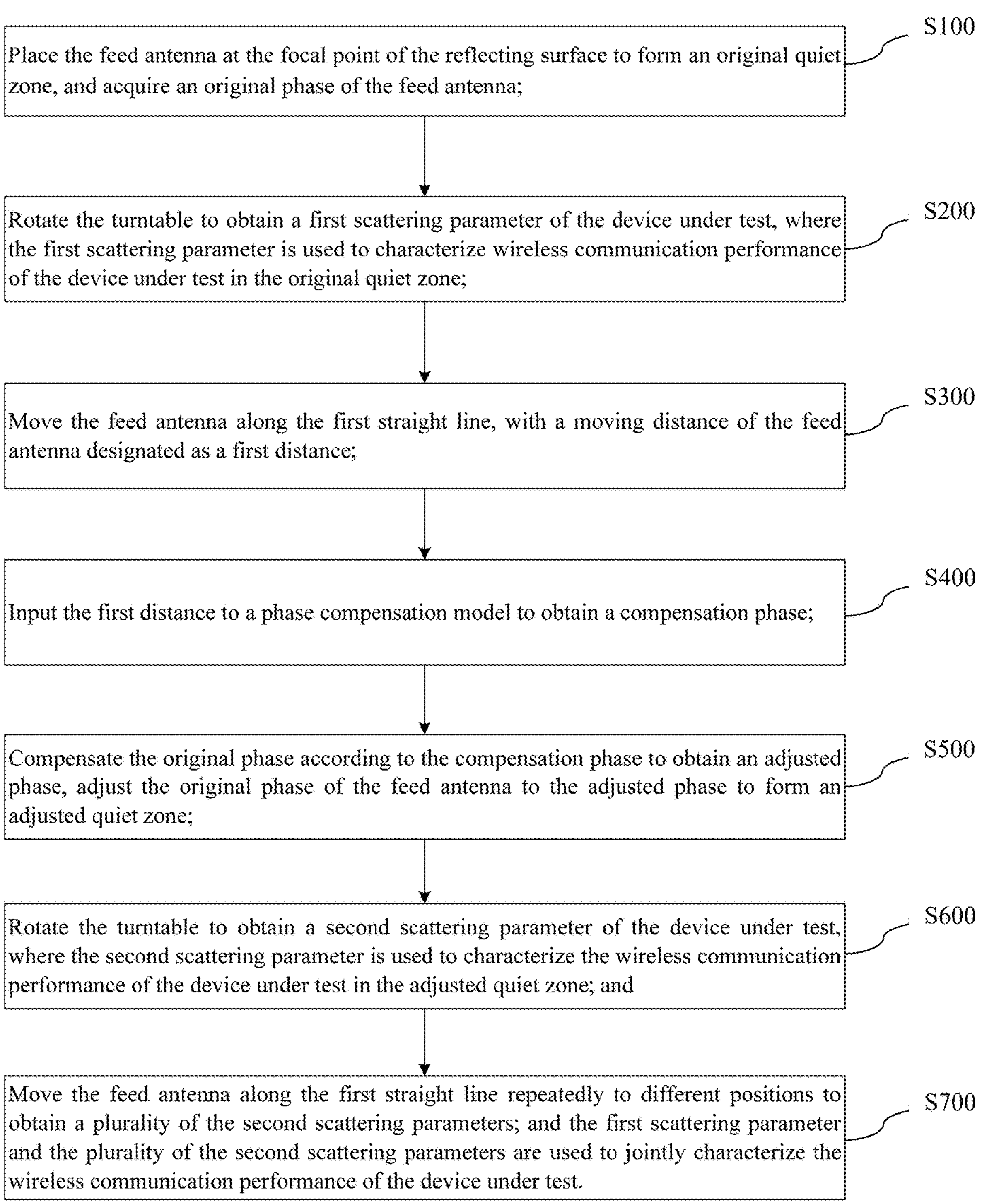
FIG. 1 is a flowchart of steps of a wireless performance testing method based on quiet zone expansion in a compact antenna test range according to Embodiment 1 of the present disclosure.

Reference numerals in the accompanying drawings: 1. scanning frame; 2. feed antenna; 3. reflecting surface; 4. turntable; 5. test link; 6. tester; 7. device under test; and 8. processor.

DETAILED DESCRIPTIONS

The present disclosure will be described in detail with reference to its embodiments, but it should be understood that the present disclosure is explained by the embodiments and not restricted to such embodiments In addition, for the convenience of description, only the parts related to the present disclosure are shown in the drawings.

It should be noted that the embodiments and the features in them in the present disclosure can be combined with each other if there are no conflicts. The present disclosure will be described in detail with reference to the attached drawings and examples.

Compact antenna test range testing refers to the testing of wireless communication performance of each antenna of a device under test by changing an orientation of the device under test that is placed in a quiet zone as a whole, and the quiet zone is formed by waves radiated from a feed antenna and reflected by a reflecting surface. However, when testing the wireless communication performance of a large device under test 7, the device under test 7 cannot be completely placed in the quiet zone due to its large volume, therefore, it cannot ensure that each antenna of the device under test 7 can be effectively tested in the quiet zone. In order to solve this problem, it is necessary to increase a size of a reflecting surface 3 to expand a range of the quiet zone. However, dimensions of a anechoic chamber needs to be increased when the size of the reflecting surface 3 is increased, which increases testing costs and makes the compact antenna test range testing inconvenient. The present disclosure aims to provide a testing method that can expand the range of the quiet zone without increasing the size of the reflecting surface 3.

Embodiment 1

With reference to FIG. 1, this example provides a wireless performance testing method based on quiet zone expansion in a compact antenna test range, the wireless performance testing method is implemented based on a wireless performance testing device, the wireless performance testing device includes a microwave anechoic chamber, a feed antenna 2 arranged inside the microwave anechoic chamber, a reflector, and a turntable 4; a device under test 7 is placed on the turntable 4, the turntable 4 is configured to drive the device under test 7 to rotate; the reflector has a reflecting surface 3, the feed antenna 2 is arranged between the reflecting surface 3 and the turntable 4, and a center of the reflecting surface 3, a focal point of the reflecting surface 3 and a center of the device under test 7 are all aligned on a same straight line; and the feed antenna 2 can be moved along a first straight line, and the first straight line passes through the focal point of the reflecting surface 3 and is perpendicular to a line connecting the center of the reflecting surface 3 and the center of the device under test 7; and the wireless performance testing method includes the following steps:

- S100: place the feed antenna 2 at the focal point of the reflecting surface 3 to form an original quiet zone, and acquire an original phase of the feed antenna 2;
- S200: rotate the turntable 4 to obtain a first scattering parameter of the device under test 7, where the first scattering parameter is used to characterize wireless communication performance of the device under test 7 in the original quiet zone;
- S300: move the feed antenna 2 along the first straight line, with a moving distance of the feed antenna 2 designated as a first distance;
- S400: input the first distance to a phase compensation model to obtain a compensation phase;
- S500: compensate the original phase according to the compensation phase to obtain an adjusted phase, adjust the original phase of the feed antenna 2 to the adjusted phase to form an adjusted quiet zone;
- S600: rotate the turntable 4 to obtain a second scattering parameter of the device under test 7, where the second scattering parameter is used to characterize the wireless communication performance of the device under test 7 in the adjusted quiet zone; and
- S700: move the feed antenna 2 along the first straight line repeatedly to different positions to obtain a plurality of the second scattering parameters; and the first scattering parameter and the plurality of the second scattering parameters are used to jointly characterize the wireless communication performance of the device under test 7.

Specifically, the reflector, the feed antenna 2, and the turntable 4 are arranged in sequence, the device under test 7 is placed on the turntable 4 to ensure that the center of the reflecting surface 3, the focal point of the reflecting surface 3, and the center of the device under test 7 are all on the same straight line. By setting parameters of the feed antenna 2, such as amplitude and phase, a spherical wave radiated from the feed antenna 2 is corrected into a plane wave after being reflected by the reflecting surface 3, such that a quiet zone used for the compact antenna test range testing is formed. Existing compact antenna test range testing methods involve the placement of the feed antenna 2 at a focal position of the reflecting surface 3.

In this example, when the compact antenna test range testing is performed, the feed antenna 2 is first placed at the focal position of the reflecting surface 3, the amplitude and phase of the feed antenna 2 are set to obtain a phase of the feed antenna 2 (that is, the original phase); a wave radiated by the feed antenna 2, after being reflected by the reflecting surface 3, forms the original quiet zone, and the turntable 4 is rotated for one circle, such that all antennas of the device under test 7 can be tested in the original quiet zone; and wireless performance of the antennas of the device under test 7 in the original quiet zone is tested in real time to obtain the first scattering parameter, and the first scattering parameter is used to characterize the wireless communication performance of the antennas of the device under test 7 in the original quiet zone. The above entire process of obtaining the first scattering parameter is actually a process of the traditional compact antenna test range testing, and differences lie in that the device under test 7 is placed in the quiet zone as a whole during the traditional compact antenna test range testing, while only part of the device under test 7 is placed in the quiet zone in the present disclosure.

Since a size of the reflecting surface 3 is fixed, when the feed antenna 2 is placed at the focal position of the reflecting surface 3, a range of the resulting quiet zone is constant, resulting in the situation that the device under test 7 cannot be entirely placed in the quiet zone. In order to solve this problem, the feed antenna 2 is moved and the phase of the feed antenna 2 is compensated by placing the feed antenna 2 at the focal position of the reflecting surface 3, such that an objective of expanding the quiet zone is achieved.

Specifically, the feed antenna 2 is moved along the first straight line, and movement directions of the feed antenna 2 are divided into a forward direction and a reverse direction. For ease of description, the movement directions are described as the feed antenna 2 moving leftward or rightward from the focal position of the reflecting surface 3. It should be noted that "moving leftward" and "moving rightward" herein are defined from the perspective of the feed antenna 2, which directly faces the reflecting surface 3. For example, after obtaining the first scattering parameter, the perspective is moved leftward along the first straight line, directly facing the feed antenna 2, and an area covered by the wave radiated from the feed antenna 2 after being reflected by the reflecting surface 3 accordingly changes; since a position of the feed antenna 2 changes, the feed antenna 2 is no longer at the focal position of the reflecting surface 3, resulting in failure to meet the requirements of the compact antenna test range testing; therefore, in order to ensure that the feed antenna 2 still meets testing requirements, a distance the feed antenna 2 moves leftward (that is, the first distance) is obtained, and the distance the feed antenna 2 moves leftward is inputted to the phase compensation model to output a compensation phase corresponding to the first distance; the original phase is compensated according to the compensation phase to obtain an adjusted phase, and the original phase of the feed antenna 2 is adjusted to the adjusted phase, such that a quiet zone (that is, the adjusted quiet zone) formed after the feed antenna 2 moves still meets the testing requirements; it should be noted that amplitude of an radiation wave thereof varies with changes of the phase when a phase of the radiation wave from the feed antenna 2 is compensated; the turntable 4 is then rotated for one circle again, such that all the antennas of the device under test 7 can be tested in the adjusted quiet zone; and wireless performance of the antennas of the device under test 7 in the adjusted quiet zone is tested in real time to obtain the second scattering parameter, and the second scattering parameter are used to characterize the wireless communication performance of the device under test 7 in the adjusted quiet zone. The position of the feed antenna 2 is adjusted leftward to compensate the phase of the feed antenna 2 is equivalent to expanding leftward based on a quiet zone (the original quiet zone) area of the traditional compact antenna test range testing, and an actual quiet zone area is equivalent to an area jointly covered by the original quiet zone and the adjusted quiet zone, such that the quite area is expanded without changing the size of the reflecting surface 3.

The quiet zone can be expanded leftward or rightward to different ranges by repeatedly moving the feed antenna 2, including moving leftward or rightward to different distances; the plurality of the second scattering parameters for characterizing the wireless communication performance of the antennas of the device under test 7 in different adjusted quiet zones can be obtained according to the above steps of obtaining the second scattering parameter, and the first scattering parameter and the plurality of the second scattering parameters are used to jointly characterize the wireless communication performance of the device under test 7.

Without increasing the size of the reflecting surface 3, the wireless performance testing method provided in this example compensates the phase of the feed antenna 2 after movements by repeatedly moving the feed antenna 2, such that the quiet zone formed after movements of the feed antenna 2 is substantially the same as the quiet zone formed when the feed antenna 2 is placed at the focal point of the reflecting surface 3, and the requirements for the compact antenna test range testing can also be satisfied. The device under test 7 in a quiet zone formed after each movement of the feed antenna 2 is tested, and results of a plurality of tests are integrated to obtain overall communication performance of the device under test 7, saving costs of replacing the reflecting surface 3 and expanding a volume of the microwave anechoic chamber.

In this example, a horizontal range of the quiet zone can be expanded by only adjusting the position of the feed antenna 2 in left and right directions; in other examples, the position of the feed antenna 2 can be adjusted in up and down directions to expand a vertical range of the quiet zone, and a specific method is the same as that when the feed antenna 2 is moved in the left and right directions.

Specifically, the first scattering parameter and the second scattering parameter are S-parameters, both of which are used to characterize the communication performance of the device under test 7; the first scattering parameter or each of the second scattering parameters includes at least a reverse transmission coefficient, a forward transmission coefficient, an input reflection coefficient, and an output reflection coefficient; and the reverse transmission coefficient represents isolation, the forward transmission coefficient represents gain, the input reflection coefficient represents input return loss, and the output reflection coefficient represents output return loss.

Specifically, after obtaining the reverse transmission coefficient, the forward transmission coefficient, the input reflection coefficient, and the output reflection coefficient corresponding to the first scattering parameter, as well as the reverse transmission coefficient, the forward transmission coefficient, the input reflection coefficient, and the output reflection coefficient corresponding to each of the second scattering parameters, each of the coefficients can be compared with a corresponding standard range of the coefficient, such that whether the wireless communication performance of the device under test 7 meets the requirements can be determined.

Further, the compensation phase is calculated via the phase compensation model according to Formula (I):

$$\Phi(x, y) = \frac{2\pi}{\lambda} L - x\sin(\theta)\cos(\beta) + y\sin(\theta)\sin(\beta) \quad \text{Formula (I)}$$

where $\phi(x, y)$ represents a phase compensation value, $\lambda$ represents a wavelength corresponding to an operating frequency of the feed antenna 2, L represents a first distance, x represents a horizontal distance of the feed antenna 2 relative to the focal point of the reflecting surface 3, y represents a vertical distance of the feed antenna 2 relative to the focal point of the reflecting surface 3, $\theta$ represents an elevation angle of the feed antenna 2 in a spherical coordinate system, and $\beta$ represents an azimuth angle of the feed antenna 2 in the spherical coordinate system; and the spherical coordinate system takes the center of the reflecting surface 3 as an origin of coordinates, a straight line passing through the center of the reflecting surface 3 and perpendicular to the reflecting surface 3 as an X-axis, a straight line passing through the center of the reflecting surface 3, perpendicular to the reflecting surface 3 and parallel to a horizontal direction as a Y-axis, and a straight line passing through the center of the reflecting surface 3, perpendicular to both the X-axis and the Y-axis as a Z-axis.

Specifically, x and y are respectively abscissa and ordinate of the feed antenna 2 in a coordinate system with the focal point of reflecting surface 3 as an origin, the first straight line as an x-axis, and a second line as a y-axis; and the second straight line is perpendicular to the first straight line and perpendicular to the line connecting the center of the reflecting surface 3 and the center of the device under test 7. In this example, since the feed antenna 2 moves along the first straight line, x represents the first distances, and y is always 0. In other examples, the feed antenna 2 can be also moved in other directions than along the first straight line.

In a preferred embodiment, the first distance is an integer multiple of a step pitch of the feed antenna 2, and the step pitch of the feed antenna 2 is calculated according to Formula (II):

$$A = \frac{F^2 \times 0.1}{D \times \lambda} \quad \text{Formula (II)}$$

where A represents step pitch of the feed antenna 2, F represents a focal length of the reflecting surface 3, and D represents a maximum diameter of the reflecting surface 3.

Considering radiation characteristics of an electromagnetic wave and characteristics of the reflecting surface 3 forming a plane wave after reflection, the wireless performance testing method is implemented to facilitate data processing.

Embodiment 2

In this example, orthographic projection of the reflecting surface 3 is a rectangle, a longer side length of the orthographic projection is 18 times a wavelength corresponding to the operating frequency of the feed antenna 2, a shorter side length of the orthographic projection is 14 times the wavelength corresponding to the operating frequency of the feed antenna 2, and the focal length of the reflecting surface 3 is 18 times wavelength corresponding to the operating frequency of the feed antenna 2.

For ease of description, movement directions of the feed antenna 2 are defined as leftward or rightward relative to the reflecting surface 3, where moving rightward is defined as a forward direction.

Figure 2:
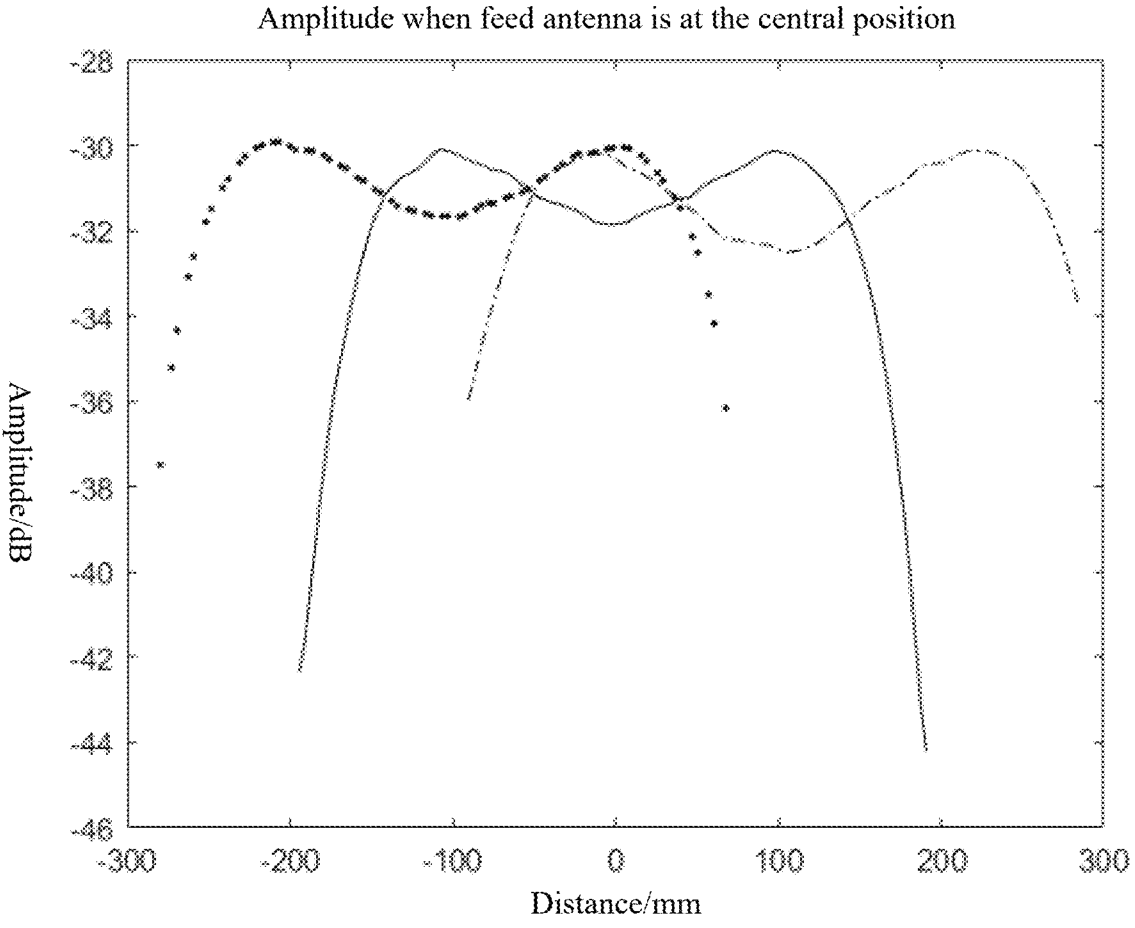
FIG. 2 is an amplitude distribution diagram of a feed antenna at a center of a reflecting surface, the feed antenna moving leftward and the feed antenna moving rightward before compensation according to Embodiment 2 of the present disclosure.
Figure 3:
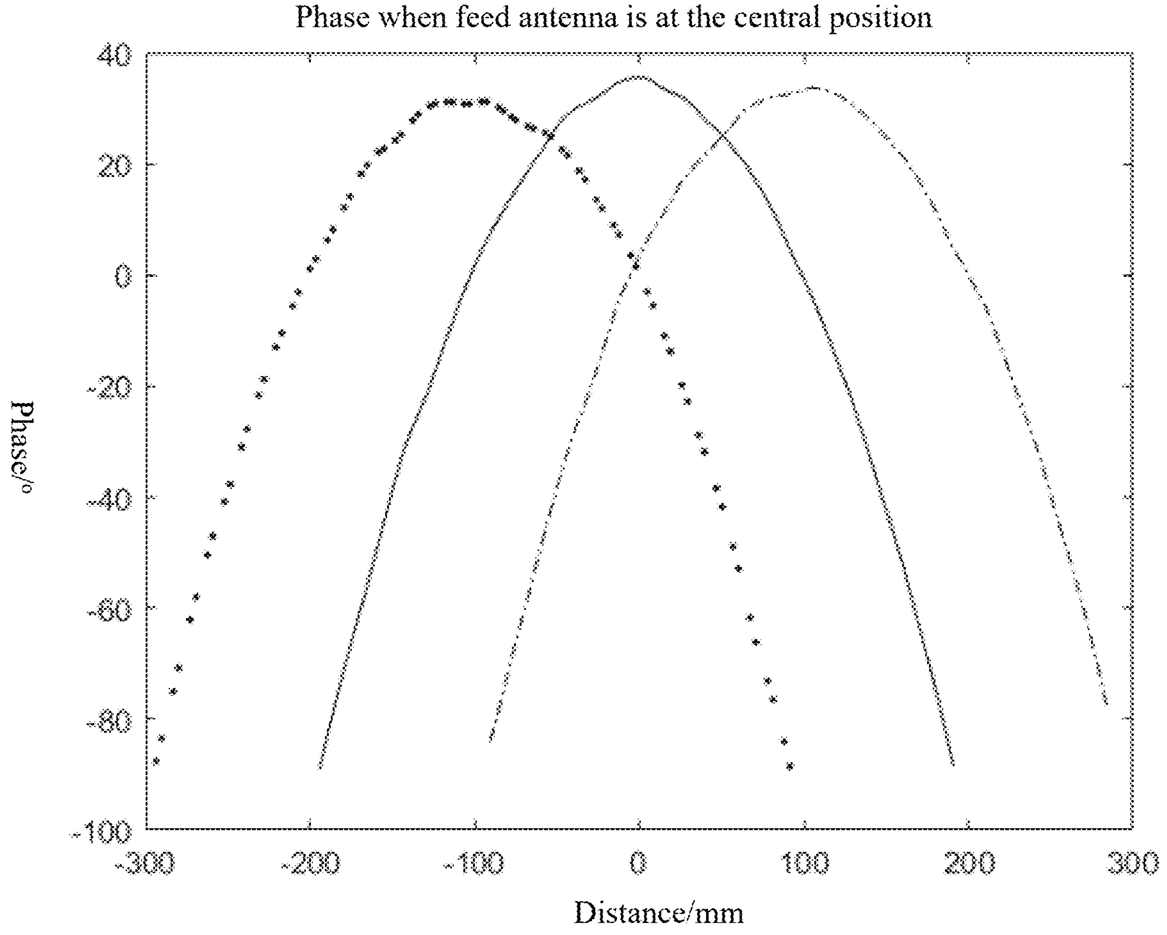
FIG. 3 is a phase distribution diagram of a feed antenna at a center of a reflecting surface, the feed antenna moving leftward and the feed antenna moving rightward before compensation according to Embodiment 2 of the present disclosure.

Before compensation, with reference to FIGS. 2 and 3, where an abscissa is a distance moved by the feed antenna 2, and an ordinate is an amplitude value; among three curves in FIG. 2, a curve in the middle represents an amplitude curve corresponding to the original quiet zone, a curve on a left side represents an amplitude curve corresponding to an adjusted quiet zone obtained after the feed antenna 2 moves leftward, and a curve on a right side represents a phase curve corresponding to an adjusted quiet zone obtained after the feed antenna 2 moves rightward; and among three curves in FIG. 3, a curve in the middle represents a phase curve corresponding to the original quiet zone, a curve on a left side represents a phase curve corresponding to an adjusted quiet zone obtained after the feed antenna 2 moves leftward, and a curve on a right side represents a phase curve corresponding to an adjusted quiet zone obtained after the feed antenna 2 moves rightward.

Figure 4:
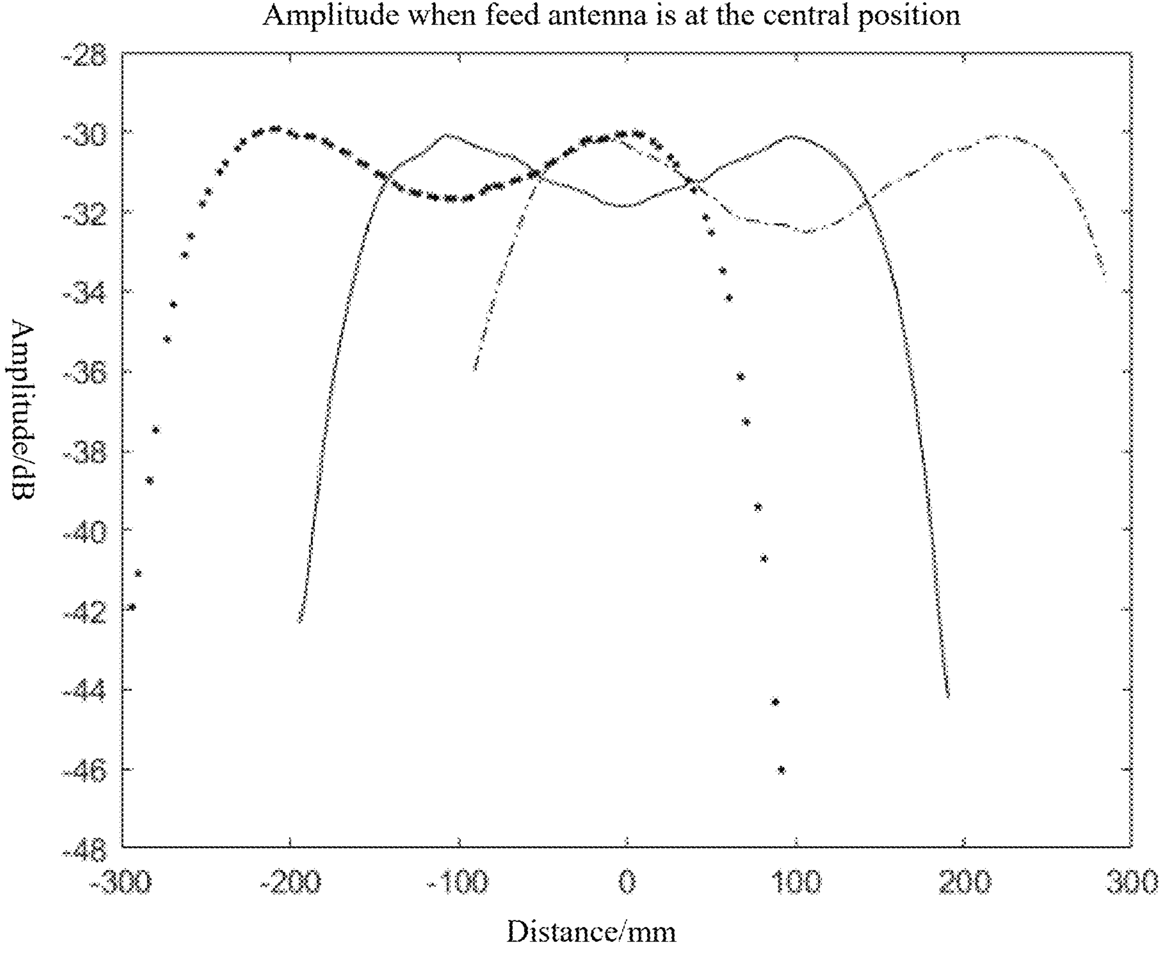
FIG. 4 is an amplitude distribution diagram of a feed antenna at a center of a reflecting surface, the feed antenna moving leftward and the feed antenna moving rightward after compensation according to Embodiment 2 of the present disclosure.
Figure 5:
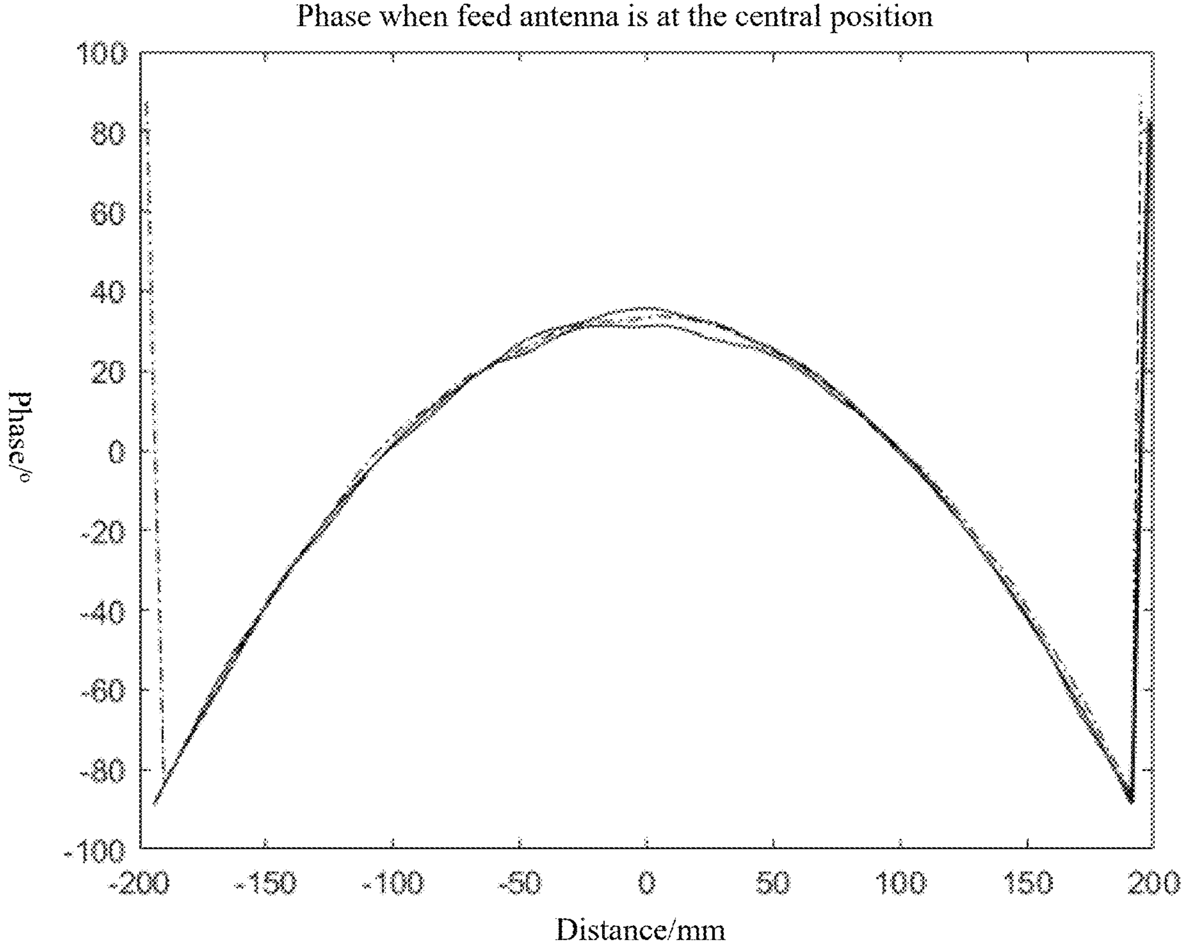
FIG. 5 is a phase distribution diagram of a feed antenna at a center of a reflecting surface, the feed antenna moving leftward and the feed antenna moving rightward after compensation according to Embodiment 2 of the present disclosure.

After compensation, with reference to FIGS. 4 and 5, where an abscissa is a distance moved by the feed antenna 2, and an ordinate is a phase; among three curves in FIG. 4, a curve in the middle represents an amplitude curve corresponding to the original quiet zone, a curve on a left side represents an amplitude curve corresponding to an adjusted quiet zone obtained after the feed antenna 2 moves leftward, and a curve on a right side represents a phase curve corresponding to an adjusted quiet zone obtained after the feed antenna 2 moves rightward; and among three curves in FIG. 5, three curves are nearly overlapped, which represent a phase curve corresponding to the original quiet zone, a phase curve corresponding to an adjusted quiet zone obtained after the feed antenna 2 moves leftward, and a phase curve corresponding to an adjusted quiet zone obtained after the feed antenna 2 moves rightward, respectively. It can be seen that the adjusted quiet zones corresponding to the feed antenna 2 after movements are close to the original quite zone after phase compensation.

By comparing FIGS. 2-5, it can be seen that a phase of the adjusted quiet zone corresponding to the feed antenna 2 moving leftward or rightward is consistent with a phase of the original quiet zone after phase compensation, but a range of the quiet zone is expanded by about 60%.

Embodiment 3

In this example, orthographic projection of the reflecting surface 3 is a rectangle, a longer side length of the orthographic projection is 20 times a wavelength corresponding to the operating frequency of the feed antenna 2, a shorter side length of the orthographic projection is 15 times the wavelength corresponding to the operating frequency of the feed antenna 2, and the focal length of the reflecting surface 3 is 20 times wavelength corresponding to the operating frequency of the feed antenna 2.

For ease of description, movement directions of the feed antenna 2 are defined as leftward or rightward relative to the reflecting surface 3, where moving rightward is defined as a forward direction.

Figure 6:
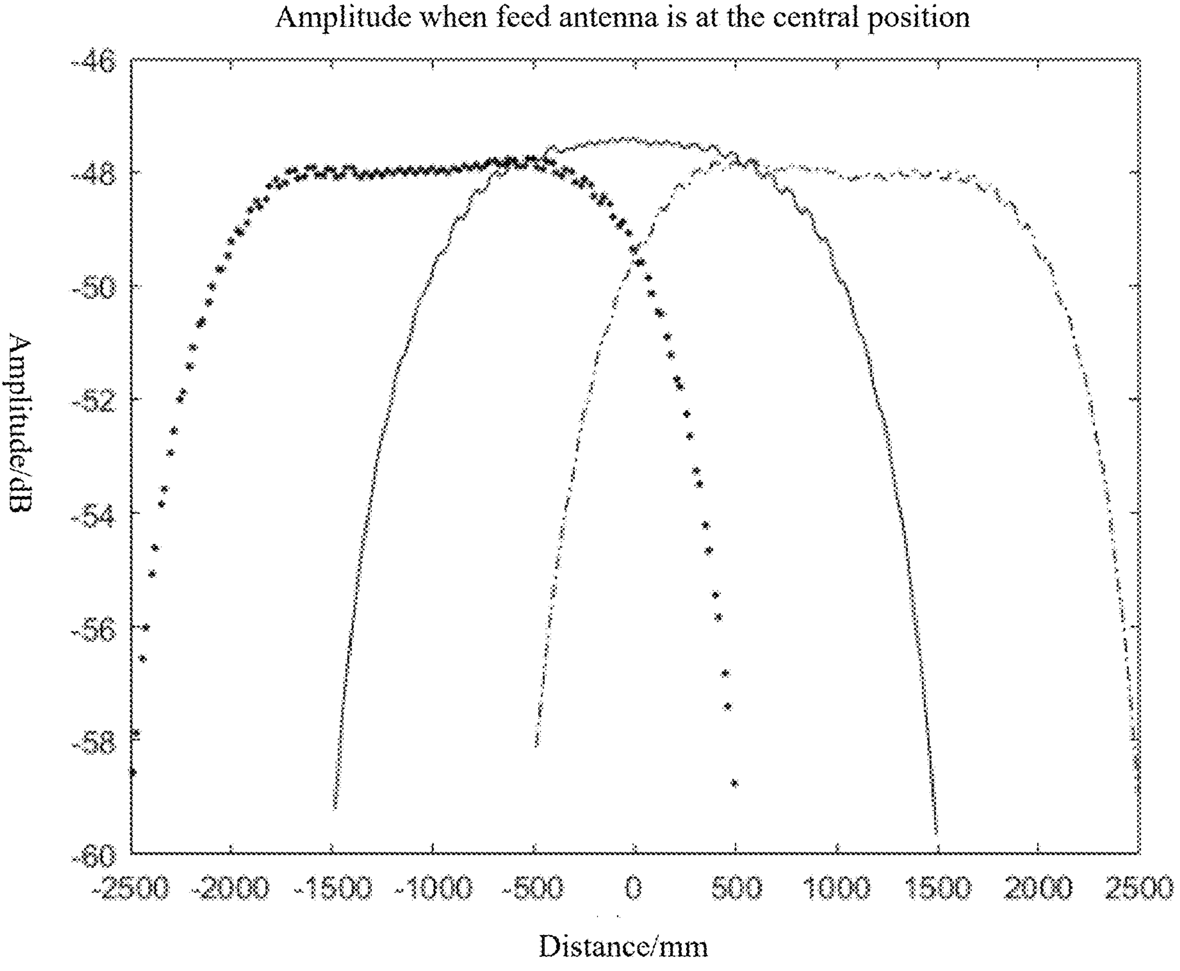
FIG. 6 is an amplitude distribution diagram of a feed antenna at a center of a reflecting surface, the feed antenna moving leftward and the feed antenna moving rightward before compensation according to Embodiment 3 of the present disclosure.
Figure 7:
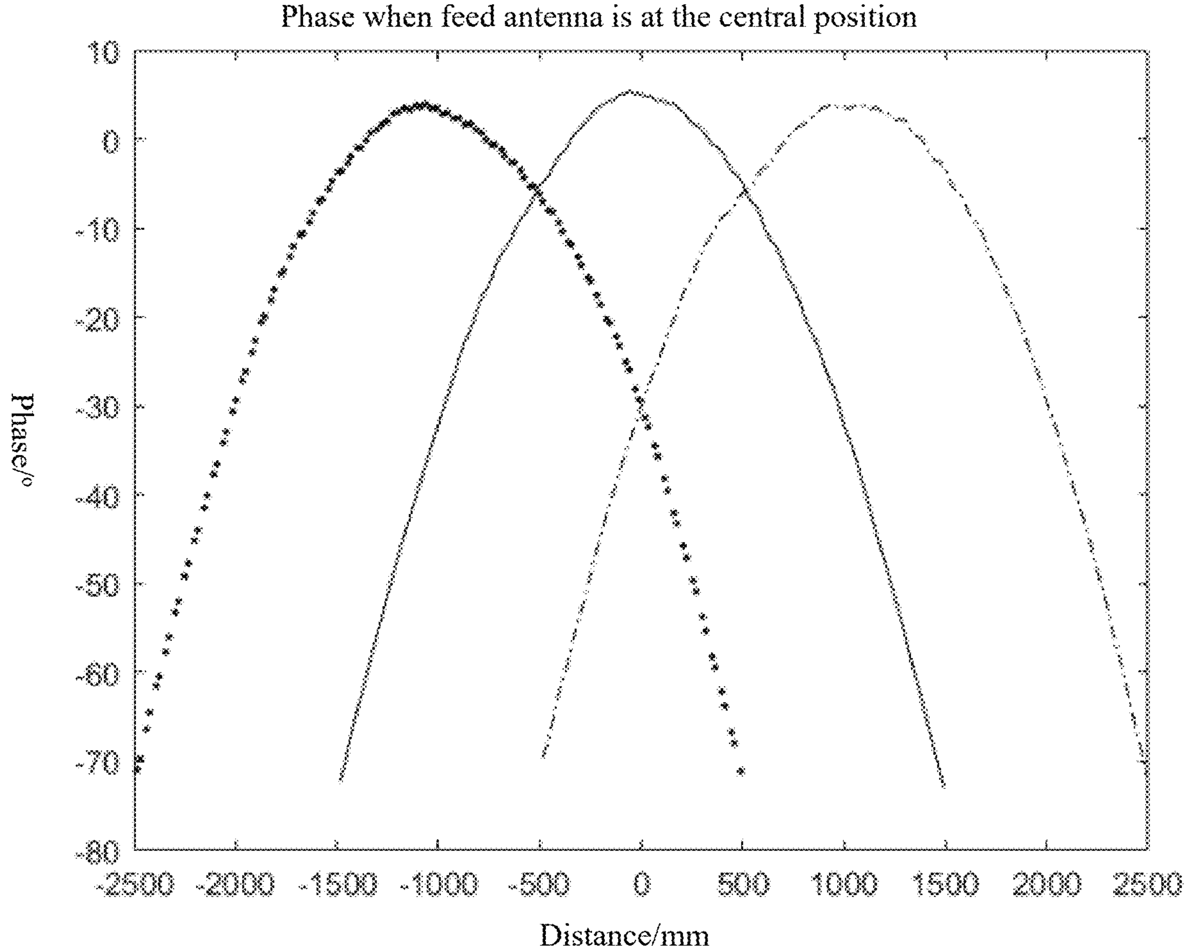
FIG. 7 is a phase distribution diagram of a feed antenna at a center of a reflecting surface, the feed antenna moving leftward and the feed antenna moving rightward before compensation according to Embodiment 3 of the present disclosure.

Before compensation, with reference to FIGS. 6 and 7, where an abscissa is a distance moved by the feed antenna 2, and an ordinate is an amplitude value; among three curves in FIG. 6, a curve in the middle represents an amplitude curve corresponding to the original quiet zone, a curve on a left side represents an amplitude curve corresponding to an adjusted quiet zone obtained after the feed antenna 2 moves leftward, and a curve on a right side represents a phase curve corresponding to an adjusted quiet zone obtained after the feed antenna 2 moves rightward; and among three curves in FIG. 7, a curve in the middle represents a phase curve corresponding to the original quiet zone, a curve on a left side represents a phase curve corresponding to an adjusted quiet zone obtained after the feed antenna 2 moves leftward, and a curve on a right side represents a phase curve corresponding to an adjusted quiet zone obtained after the feed antenna 2 moves rightward.

Figure 8:
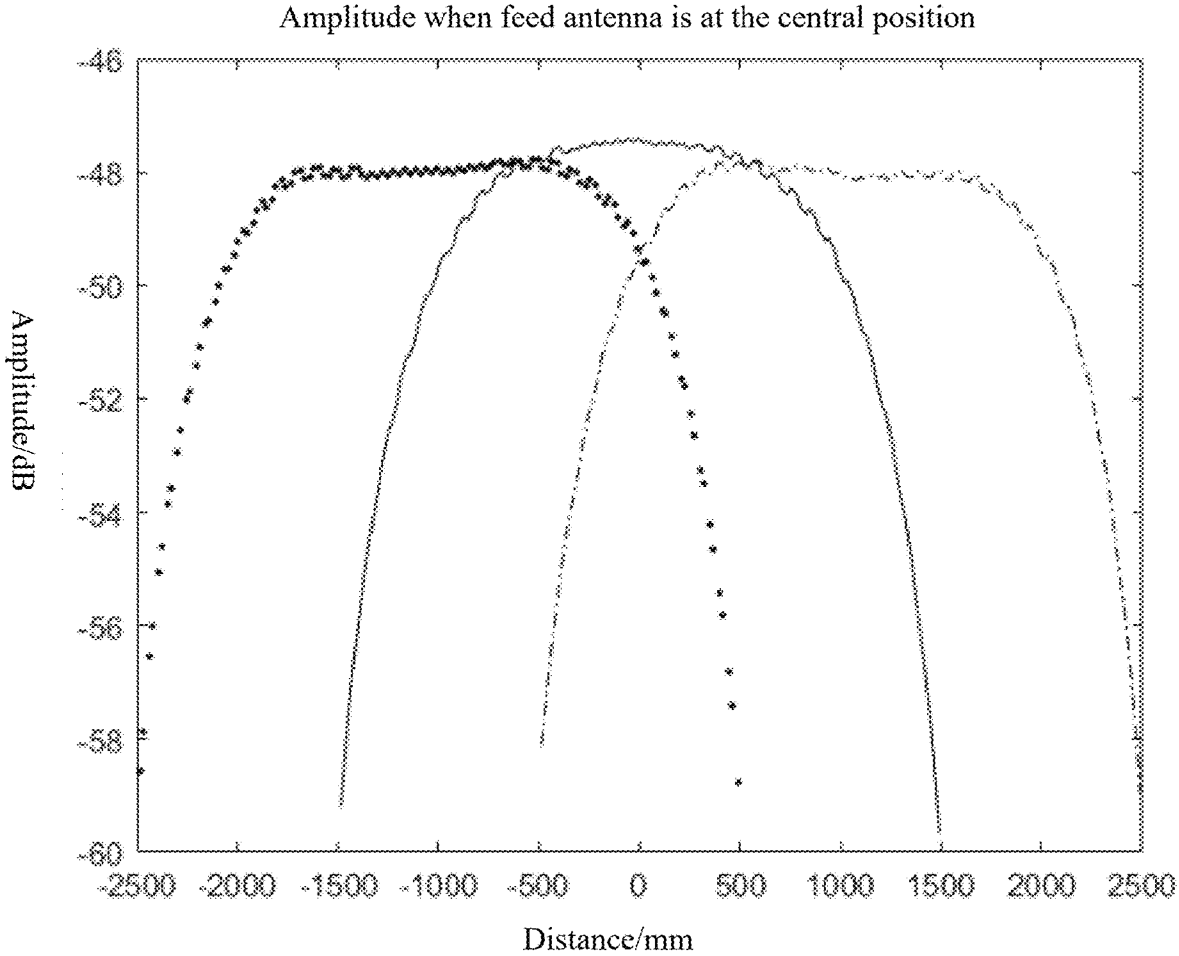
FIG. 8 is an amplitude distribution diagram of a feed antenna at a center of a reflecting surface, the feed antenna moving leftward and the feed antenna moving rightward after compensation according to Embodiment 3 of the present disclosure.
Figure 9:
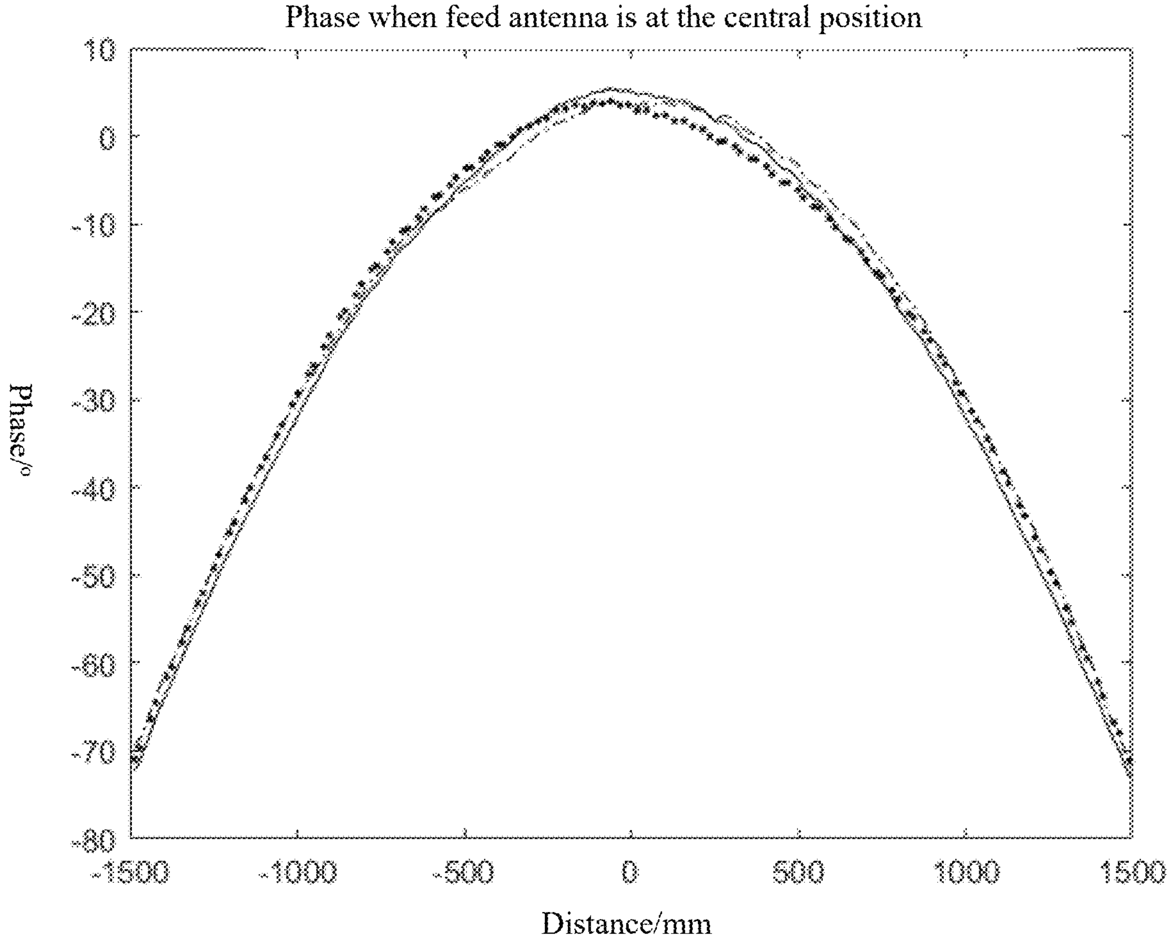
FIG. 9 is a phase distribution diagram of a feed antenna at a center of a reflecting surface, the feed antenna moving leftward and the feed antenna moving rightward after compensation according to Embodiment 3 of the present disclosure.

After compensation, with reference to FIGS. 8 and 9, where an abscissa is a distance moved by the feed antenna 2, and an ordinate is a phase; among three curves in FIG. 8, a curve in the middle represents an amplitude curve corresponding to the original quiet zone, a curve on a left side represents an amplitude curve corresponding to an adjusted quiet zone obtained after the feed antenna 2 moves leftward, and a curve on a right side represents a phase curve corresponding to an adjusted quiet zone obtained after the feed antenna 2 moves rightward; and among three curves in FIG. 9, three curves are nearly overlapped, which represent a phase curve corresponding to the original quiet zone, a phase curve corresponding to an adjusted quiet zone obtained after the feed antenna 2 moves leftward, and a phase curve corresponding to an adjusted quiet zone obtained after the feed antenna 2 moves rightward, respectively. It can be seen that the adjusted quiet zones corresponding to the feed antenna 2 after movements are close to the original quite zone after phase compensation.

By comparing FIGS. 6-9, it can be seen that a phase of the adjusted quiet zone corresponding to the feed antenna 2 moving leftward or rightward is consistent with a phase of the original quiet zone after phase compensation, but a range of the quiet zone is expanded by about 80%.

The above Embodiments 2 and 3 show that the wireless performance testing method provided by the present disclosure is practical and effective for expanding the quiet zone.

Embodiment 4

Figure 10:
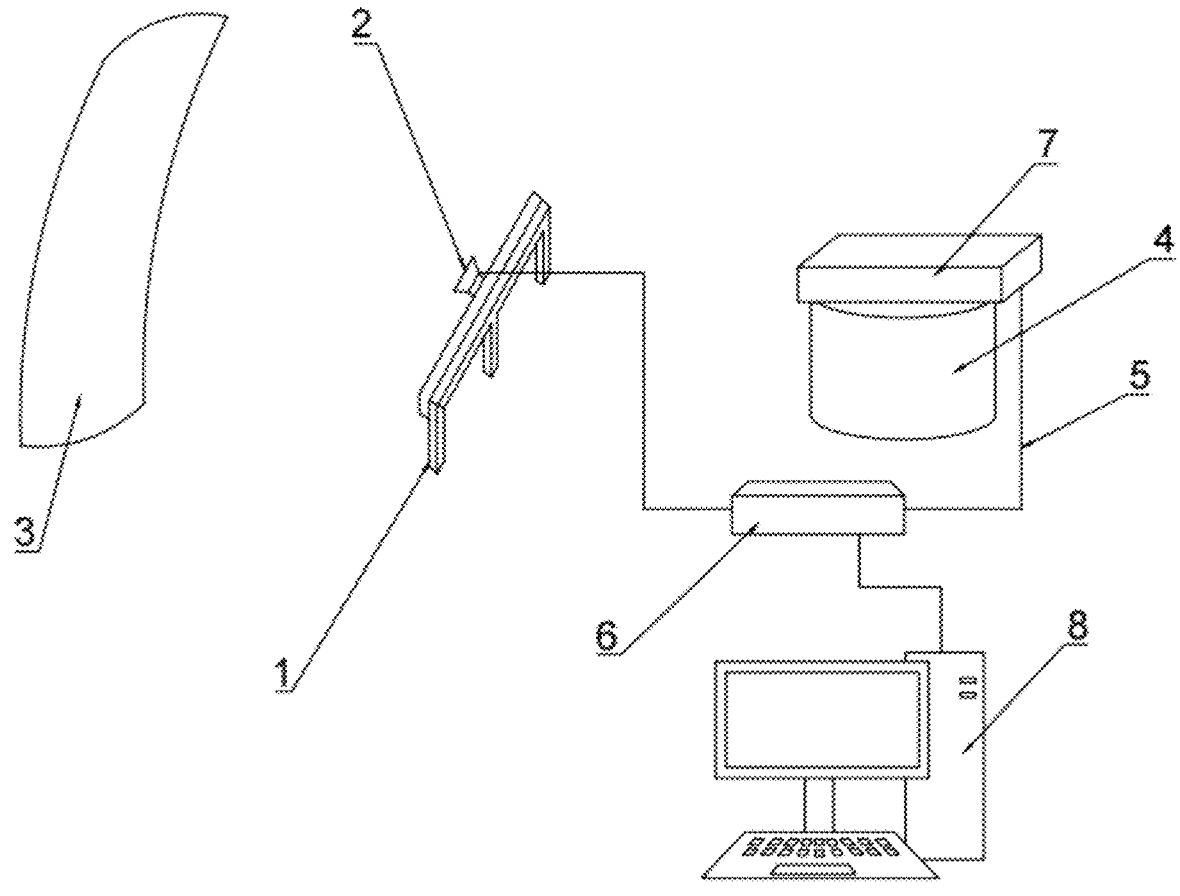
FIG. 10 is a structural schematic diagram of a wireless performance testing system based on quiet zone expansion in a compact antenna test range according to Embodiment 4 of the present disclosure.

With reference to FIG. 10, this embodiment provides a wireless performance testing system based on quiet zone expansion in a compact antenna test range, which is used to implement the wireless performance test method based on quiet zone expansion in a compact antenna test range described in Embodiment 1, and the test system includes the wireless performance testing device, and further includes the following components arranged outside the microwave anechoic chamber:

a processor 8, the processor 8 is configured to obtain an original phase of the feed antenna 2; the processor is also configured to obtain a first distance that the feed antenna 2 moves; the first distance is inputted to a phase compensation model to obtain a compensation phase; and the original phase is compensated according to the compensation phase to obtain an adjusted phase, and the original phase of the feed antenna 2 is adjusted to the adjusted phase; and a tester 6, the tester 6 is configured to obtain a first scattering parameter of the device under test 7; and the tester is also configured to obtain second scattering parameter of the device under test 7.

Specifically, an axis of the turntable 4 is perpendicular to a floor of the microwave anechoic chamber, and the turntable 4 rotates around its own axis. The tester 6 is electrically connected to the feed antenna 2 and the device under test 7 via a test link 5; when the turntable 4 rotates, the tester 6 obtains the first scattering parameter or the second scattering parameter in real time, and the tester 6 is a vector network analyzer. The processor 8 is a computer, and the processor 8 is electrically connected to the tester 6 via the test link 5, the processor 8 can be configured to set parameters such as phase and amplitude of the feed antenna 2, and the processor can also be configured to calculate a corresponding compensated phase according to a distance moved by the feed antenna 2.

In other embodiments, a position of the feed antenna 2 can be adjusted in a vertical direction by adjusting a direction of a scanning frame 1, thereby achieving the objective of expanding the quiet zone in the vertical direction.

The system provided in this embodiment can expand a range of the quiet zone to accommodate testing of the device under test 7 having a large volume without increasing a size of the reflecting surface 3 by adjusting the position of the feed antenna 2 and compensating the phase of the feed antenna 2.

Further, the wireless performance testing device also includes the scanning frame 1, the scanning frame 1 is arranged between the reflecting surface 3 and the turntable 4; and the scanning frame 1 is provided with a plurality of mounting positions for mounting the feed antenna 2, and the plurality of mounting positions are evenly arranged along a first straight line.

Specifically, the feed antenna 2 can be detachably mounted on the mounting positions, a distance between adjacent mounting positions is a step pitch of the feed antenna 2, that is, a difference between a distance after each position adjustment of the feed antenna 2 and a distance before the position adjustment can only be an integer multiple of the step pitch.

Preferably, inner sides of walls of the microwave anechoic chamber are lined with absorbing material. By lining with absorbing material, the problem of inaccurate test results caused by reflection of waves by the walls of the microwave anechoic chamber can be eased.

Preferably, the reflecting surface 3 is a parabolic reflecting surface 3, and a concave side thereof faces the device under test 7.

Specifically, the feed antenna 2 adopts any polarization mode; and optionally, the polarization modes can be linear polarization, circular polarization, and elliptical polarization.

The above description is only a preferred embodiment of the present disclosure and an explanation of the technical principles applied. Those skilled in the art should understand that the scope of the present disclosure involved in the present disclosure is not limited to the technical solution formed by the specific combination of the above technical features. It should also cover other technical solutions formed by arbitrarily combining the above technical features or their equivalent features without departing from the inventive concept. For example, the above features can be replaced with technical features disclosed in the present disclosure (but not limited to) that have similar functions to form other technical solutions.

The invention claimed is:

1. A wireless performance testing method based on quiet zone expansion in a compact antenna test range, wherein the wireless performance testing method is implemented based on a wireless performance testing device, the wireless performance testing device includes a microwave anechoic chamber, a feed antenna arranged inside the microwave anechoic chamber, a reflector, and a turntable; a device under test is placed on the turntable, the turntable is configured to drive the device under test to rotate; the reflector has a reflecting surface, the feed antenna is arranged between the reflecting surface and the turntable, and a center of the reflecting surface, a focal point of the reflecting surface and a center of the device under test are aligned on a same straight line; and the feed antenna can be moved along a first straight line, and the first straight line passes through the focal point of the reflecting surface and is perpendicular to a line connecting the center of the reflecting surface and the center of the device under test; and the wireless performance testing method includes following steps:

placing the feed antenna at the focal point of the reflecting surface to form an original quiet zone, and acquire an original phase of the feed antenna;

rotating the turntable to obtain a first scattering parameter of the device under test, where the first scattering parameter is used to characterize wireless communication performance of the device under test in the original quiet zone;

moving the feed antenna along the first straight line, with a moving distance of the feed antenna designated as a first distance;

inputting the first distance to a phase compensation model to obtain a compensation phase;

compensating the original phase according to the compensation phase to obtain an adjusted phase, adjust the original phase of the feed antenna to the adjusted phase to form an adjusted quiet zone;

rotating the turntable to obtain a second scattering parameter of the device under test, where the second scattering parameter is used to characterize the wireless communication performance of the device under test in the adjusted quiet zone; and moving the feed antenna along the first straight line repeatedly to different positions to obtain a plurality of the second scattering parameters; and the first scattering parameter and the plurality of the second scattering parameters are used to jointly characterize the wireless communication performance of the device under test.

2. The wireless performance testing method based on quiet zone expansion in a compact antenna test range of claim 1, wherein the first scattering parameter or the second scattering parameter includes at least a reverse transmission coefficient, a forward transmission coefficient, an input reflection coefficient, and an output reflection coefficient.

3. The wireless performance testing method based on quiet zone expansion in a compact antenna test range of claim 2, wherein the compensation phase is calculated via the phase compensation model according to Formula (I):

$$\Phi(x, y) = \frac{2\pi}{\lambda}L - x\sin(\theta)\cos(\beta) + y\sin(\theta)\sin(\beta) \quad \text{Formula (I)}$$

where $\phi(x, y)$ represents a phase compensation value, $\lambda$ represents a wavelength corresponding to an operating frequency of the feed antenna, L represents a first distance, x represents a horizontal distance of the feed antenna relative to the focal point of the reflecting surface, y represents a vertical distance of the feed antenna relative to the focal point of the reflecting surface, $\theta$ represents an elevation angle of the feed antenna in a spherical coordinate system, and $\beta$ represents an azimuth angle of the feed antenna in the spherical coordinate system; and the spherical coordinate system takes the center of the reflecting surface as an origin of coordinates, a straight line passing through the center of the reflecting surface and perpendicular to the reflecting surface as an X-axis, a straight line passing through the center of the reflecting surface, perpendicular to the reflecting surface and parallel to a horizontal direction as a Y-axis, and a straight line passing through the center of the reflecting surface, perpendicular to both the X-axis and the Y-axis as a Z-axis.

4. The wireless performance testing method based on quiet zone expansion in a compact antenna test range of claim 3, wherein the first distance is an integer multiple of a step pitch of the feed antenna, and the step pitch of the feed antenna is calculated according to Formula (II):

$$A = \frac{F^2 \times 0.1}{D \times \lambda} \quad \text{Formula (II)}$$

where A represents step pitch of the feed antenna, F represents a focal length of the reflecting surface, and D represents a maximum diameter of the reflecting surface.

5. The wireless performance testing method based on quiet zone expansion in a compact antenna test range of claim 4, wherein orthographic projection of the reflecting surface is a rectangle, a longer side length of the orthographic projection is 18 times a wavelength corresponding to the operating frequency of the feed antenna, a shorter side length of the orthographic projection is 14 times the wavelength corresponding to the operating frequency of the feed antenna, and the focal length of the reflecting surface is 18 times wavelength corresponding to the operating frequency of the feed antenna.

6. The wireless performance testing method based on quiet zone expansion in a compact antenna test range of claim 4, wherein orthographic projection of the reflecting surface is a rectangle, a longer side length of the orthographic projection is 20 times a wavelength corresponding to the operating frequency of the feed antenna, a shorter side length of the orthographic projection is 15 times the wavelength corresponding to the operating frequency of the feed antenna, and the focal length of the reflecting surface is 20 times wavelength corresponding to the operating frequency of the feed antenna.

7. A wireless performance testing system based on quiet zone expansion in a compact antenna test range, wherein the wireless performance testing system is used to implement the wireless performance testing method based on quiet zone expansion in a compact antenna test range of claim 6, and the wireless performance testing system includes the wireless performance testing device, and further includes following components arranged outside the microwave anechoic chamber:

a processor, the processor is configured to obtain an original phase of the feed antenna; the processor is also configured to obtain a first distance that the feed antenna moves; the first distance is inputted to a phase compensation model to obtain a compensation phase; and the original phase is compensated according to the compensation phase to obtain an adjusted phase, and the original phase of the feed antenna is adjusted to the adjusted phase; and a tester, the tester is configured to obtain a first scattering parameter of the device under test; and the tester is also configured to obtain second scattering parameters of the device under test.

8. The wireless performance testing system based on quiet zone expansion in a compact antenna test range of claim 7, wherein inner sides of walls of the microwave anechoic chamber are lined with absorbing material.

9. The wireless performance testing system based on quiet zone expansion in a compact antenna test range of claim 7, wherein the reflecting surface is a parabolic reflecting surface, and a concave side thereof faces the device under test.

10. The wireless performance testing system based on quiet zone expansion in a compact antenna test range of claim 7, wherein further including a scanning frame, the scanning frame is arranged between the reflecting surface and the turntable; and the scanning frame is provided with a plurality of mounting positions for mounting the feed antenna, and the plurality of mounting positions are evenly arranged along a first straight line.

* * * * *